(12) United States Patent
Goto

(10) Patent No.: US 10,840,220 B2
(45) Date of Patent: Nov. 17, 2020

(54) SEMICONDUCTOR DEVICE

(71) Applicant: Toshiba Memory Corporation, Tokyo (JP)

(72) Inventor: Yoshiaki Goto, Kiyosu Aichi (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/551,092

(22) Filed: Aug. 26, 2019

(65) Prior Publication Data

US 2020/0303345 A1    Sep. 24, 2020

(30) Foreign Application Priority Data

Mar. 22, 2019    (JP) .................................. 2019-054415

(51) Int. Cl.
  *H01L 25/065* (2006.01)
  *H01L 23/49* (2006.01)
  *H01L 23/538* (2006.01)

(52) U.S. Cl.
  CPC .......... *H01L 25/0657* (2013.01); *H01L 23/49* (2013.01); *H01L 23/5385* (2013.01); *H01L 23/5386* (2013.01)

(58) Field of Classification Search
  None
  See application file for complete search history.

(56) References Cited

U.S. PATENT DOCUMENTS

| | | | |
|---|---|---|---|
| 10,157,883 B2 | 12/2018 | Park et al. | |
| 2011/0062581 A1* | 3/2011 | Kim | H01L 24/16 257/737 |
| 2015/0200187 A1* | 7/2015 | Park | H01L 24/49 257/777 |
| 2018/0026022 A1 | 1/2018 | Lee et al. | |
| 2018/0122771 A1* | 5/2018 | Park | H01L 25/0652 |
| 2018/0277529 A1 | 9/2018 | Matsumoto | |
| 2018/0342481 A1 | 11/2018 | Lee et al. | |
| 2020/0105734 A1* | 4/2020 | Akada | H01L 24/73 |

FOREIGN PATENT DOCUMENTS

JP    2018-160157 A    10/2018

* cited by examiner

*Primary Examiner* — Thien F Tran
(74) *Attorney, Agent, or Firm* — Kim & Stewart LLP

(57) ABSTRACT

A semiconductor device of an embodiment includes a substrate, first, second, third, and fourth semiconductor elements, a first wiring layer, and first and second bonding wires. The third semiconductor element is on the substrate between the first resin element and the second resin element. The first wiring layer is on the first semiconductor element, is connected to the first semiconductor element, and is connected to the substrate by the first bonding wire. The fourth semiconductor element is on the first wiring layer and is connected to the first wiring layer by a second bonding wire. The first bonding wire is at a side of the first wiring layer other than a side farthest from the second wiring layer.

20 Claims, 3 Drawing Sheets

US 10,840,220 B2

SEMICONDUCTOR DEVICE

CROSS-REFERENCE TO RELATED APPLICATIONS

This application is based upon and claims the benefit of priority from Japanese Patent Application No. 2019-054415, filed Mar. 22, 2019, the entire contents of which are incorporated herein by reference.

FIELD

Embodiments described herein relate generally to a semiconductor device.

BACKGROUND

In a semiconductor device including a memory chip, various package layouts are utilized. In general, it is preferred to design semiconductor devices with increases in capacity, reductions in size, and increases in speed of input and output.

When attempting to speedup operations of a semiconductor device that incorporates a memory chip, the associated controller chip tends to be made larger. When attempting to incorporate more memory chips into a semiconductor device to increase storage capacity, the planar size of the semiconductor device tends to increase even though memory chips are stacked upon each other since typically memory chips are stacked in a stair stepped shape. When tightening the memory chip design rules (e.g., narrowing chip feature dimensions such as line widths), to provide increased memory storage capacity per memory chip, the die size per chip may still become larger than before.

Therefore, when the chip size increases without increasing the package size of the semiconductor device, it may be difficult to provided the controller chip and the memory chip adjacent to each other on a substrate. To prevent the controller chip and the memory chip(s) from interfering with each other, it is also possible to utilize a spacer chip having external dimensions that are smaller than that of the memory chip and to position the memory chip above than the controller chip with the spacer chip therebetween.

However, since this technique requires additional processes such as BSG (Back Side Grinding) performed on a mirror wafer, the use of a die attach film is attached thereto, a spacer chip cut to a desired size and attached on a substrate, and the like, the cost of manufacturing semiconductor devices may be increased. Similarly, for the same number of memory chips in a package, the semiconductor device increases by at least the height of the spacer chip, and it is typically difficult to reduce the thickness of the semiconductor device by other methods. Likewise, since the controller chip is typically smaller than a memory chip, an empty (unused) space may be created when the spacer chip is utilized. Since empty space is difficult to avoid, it is difficult to further minimize the size of the semiconductor device.

DETAILED DESCRIPTION

Embodiments described herein are directed to the downsizing and thinning of semiconductor devices.

In general, according to an embodiment, a semiconductor device includes a substrate, first to fifth semiconductor elements, first and second wiring layers, and first to third bonding wires. The first semiconductor element is provided on a first resin element on the substrate. The second semiconductor element is provided on a second resin element on the substrate. The third semiconductor element is provided on the substrate between the first resin element and the second resin element. The first wiring layer is provided on the first semiconductor element, is connected to the first semiconductor element, and is connected to the substrate with the first bonding wire. The fourth semiconductor element is provided on the first wiring layer and is connected to the first wiring layer with the second bonding wire. The second wiring layer is provided on the second semiconductor element, is connected to the second semiconductor element, and is connected to the substrate with the third bonding wire. The fifth semiconductor element is provided on the second wiring layer and is connected to the second wiring layer with the fourth bonding wire. The first bonding wire is at a side of the first wiring layer other than the side farthest away from the second wiring layer. The third bonding wire is provided at sides of the second wiring layer other than a side farthest away from the first wiring layer.

Hereinafter, example embodiments will be described with reference to the drawings.

The depicted and described example embodiments are not limitations of the present disclosure.

In addition, the drawings are schematic, and the relationship between thickness and planar dimensions, the ratio of the thickness of each layer, or the like may differ from actual implementations. In addition, there may be parts where the dimensional relationships and proportions differ between the drawings. In general, aspects or elements depicted in multiple drawings will be provided common reference symbols and repeated explanations of these aspects or elements may be omitted.

Example Embodiment

Figure 1:
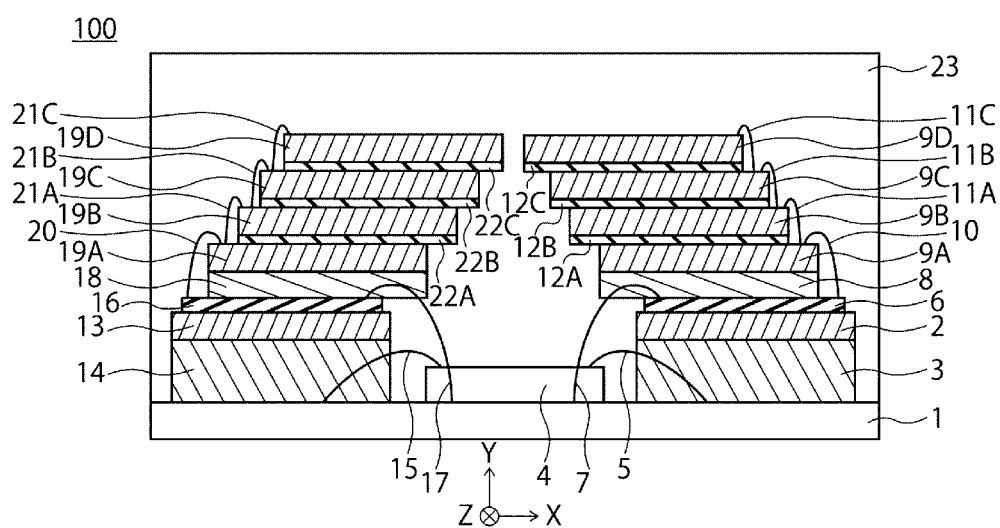
FIG. 1 illustrates a schematic cross-sectional view of a semiconductor device according to an embodiment.

FIG. 1 schematically shows a cross-sectional view of a semiconductor device 100 according to an embodiment. The semiconductor device 100 is a semiconductor package including a semiconductor element which is, for example, a controller chip and a semiconductor element which is, for example, a semiconductor memory chip. More specifically, the semiconductor device 100 of this example is a so-called BGA-SSD (Ball Grid Array-Solid State Drive), and includes a plurality of semiconductor memory chips and a controller are integrally configured as one BGA type package.

The semiconductor device 100 in FIG. 1 includes a substrate 1, a first semiconductor element 2, a first resin element 3, a third semiconductor element 4, bonding wires 5, 7, 10, 11, 15, 17, 20, and 21, a first wiring layer 6, a third resin element 8, a fourth semiconductor element 9, adhesive layer 12, adhesive layer 22, a second semiconductor element 13, a second resin element 14, a second wiring layer 16, a fourth resin element 18, a fifth semiconductor element 19, and a sealing material 23.

The substrate 1 is a support substrate for the semiconductor elements 2, 4, 9, 13, and 19. More specifically, the substrate 1 is a multilayer wiring substrate. The semiconductor elements 2, 4, 9, 13, and 19 are provided on the first surface side of the substrate 1. On a second surface side opposite to a first surface of the substrate 1, a electrode, such as a solder ball, for connection to the outside of the semiconductor device 100 is provided.

The semiconductor device 100 includes the first semiconductor element 2, the second semiconductor element 13, the fourth semiconductor element 9, and the fifth semiconductor element 19, which are each memory chips. The first semiconductor element 2 and the second semiconductor element 13 are provided on a substrate 1 side. For example, the fourth semiconductor element 9 is one or more memory chips provided on the first semiconductor element 2. For example, the fifth semiconductor element 19 is one or more memory chips provided on the second semiconductor element 13.

In this context, a memory chip is a semiconductor chip to which data can be written and from which data can read. As a nonvolatile memory chip, a NAND memory chip, a phase change memory chip, a resistance change memory chip, a ferroelectric memory chip, a magnetic memory chip, or the like may be used. As a volatile memory chip, DRAM (Dynamic Random-Access Memory) or the like may be used. In a preferred embodiment, the memory chips have the same circuitry structure excepting individualizing differences related to addressing or the like. In addition, in the present embodiment, either a nonvolatile memory chip or a volatile memory chip may be used as the memory chip. A semiconductor chip other than a memory chip may also be used.

In order to achieve both large capacity and high speed, it is preferable that an aspect ratio (in this context, "aspect ratio" is a long side dimension (length of side surface in longitudinal direction) divided by a short side dimension (length of side surface in short side direction)) of the first semiconductor element 2, the second semiconductor element 13, the fourth semiconductor element 9, and the fifth semiconductor element 19 be equal to or greater than 1.5 but equal to or less than 3.5. The long sides of these elements are provided such that long side corresponds to long side.

The first semiconductor element 2 is a semiconductor chip provided on the substrate 1. More specifically, in this example, the first semiconductor element 2 is a memory chip provided on the first resin element 3 on the substrate 1.

The first resin element 3 has an adhesive resin composition and can be a die attach film (DAF) or the like. The first resin element 3 is provided on the substrate 1, and bonded to the first semiconductor element 2. In the first resin element 3, one or more fifth bonding wires 5, which are a group of the bonding wires that connect the third semiconductor element 4 and the substrate 1, are positioned. Since these wires are embedded in the first resin element 3, the structure in which the first semiconductor element 2 is stacked with the first resin element 3, is a FOW (Film on Wire).

The third semiconductor element 4 is the semiconductor chip fixed on the substrate 1 by an adhesive such as a DAF having a thickness of 5 μm to 20 μm. The third semiconductor element 4 is a controller of, for example, the memory chip. The third semiconductor element 4 is connected to the outside of the semiconductor device 100, controls reading and writing of the memory chip(s), and performs, for example, speeding up of reading and writing, error correction, and the like. Since the third semiconductor element 4 is not a flip chip, an electrode pad of the third semiconductor element 4 is disposed on a side (memory chip side) opposite to the substrate 1 side. In the following, the first semiconductor element 2 is called as a first memory chip 2, the second semiconductor element 13 is called as a second memory chip 13, the third semiconductor element 4 is called as a controller chip 4, the fourth semiconductor element 9 is called as a third memory chip 9, and the fifth semiconductor element 19 is called as a fourth memory chip 19.

The controller chip 4 is disposed at an X direction position between the X direction positions of the first memory chip 2 and the second memory chip 13. A surface of the controller chip 4 facing away from the substrate 1 includes an electrode pad thereon. At least the center region of this surface is covered with the sealing material 23. In the schematic diagram of FIG. 1, the controller chip 4 is disposed between the first resin element 3 and the second resin element 14, the sealing material 23 is provided between the first resin element 3 and the controller chip 4, and the sealing material 23 is also provided between the second resin element 14 and the controller chip 4.

It is preferable that a structure in which the first memory chip 2 and the third memory chip 9 are stacked in a Y direction via a resin element or adhesive layer 12 and a structure in which the second memory chip 13 and the fourth memory chip 19 are stacked via a resin element or adhesive layer 22 be arranged symmetrically about the controller chip 4.

The controller chip 4 is closer to substrate 1 than the first memory chip 2 and the second memory chip 13. Since the controller chip 4 is closer to the substrate 1 and is located near the center of the substrate 1, the stacked structure of symmetrical memory chips can be efficiently disposed to achieve both high capacity and high-speed reading and writing.

From the above viewpoint, it is preferable that the controller chip 4 be aligned with, in the Y direction, the center point of a virtual line along the X direction connecting the first memory chip 2 and the second memory chip 13.

The fifth bonding wire 5 is a bonding wire connecting the substrate 1 and the controller chip 4. The fifth bonding wire 5 connects to an electrode pad on the substrate and an electrode pad of the controller chip 4. The fifth bonding wire 5 is disposed between the first memory chip 2 and the substrate 1. At least a part of the substrate 1 side of the fifth bonding wire 5 is embedded in the first resin element 3 and sealed. When a portion of the fifth bonding wire 5 is not embedded in the first resin element 3, this portion is sealed with the sealing material 23.

The first wiring layer 6 is a rewiring layer provided on the first memory chip 2. The first wiring layer 6 is connected to the first memory chip 2. The first wiring layer 6 and the memory chip 2 are in directly contact with each other, and an electrode pad of the first memory chip 2 is electrically connected to a wire of the first wiring layer 6. By using the first wiring layer 6, a first bonding wire 7 connecting the first memory chip 2 and the substrate 1 can be provided on a side other than the side opposite to the side of the first wiring layer 6 facing the second wiring layer 16. A size of the first wiring layer 6, more specifically, a size of the surface (and opposite surface) facing the first memory chip 2 is smaller than that of the first memory chip 2.

The first bonding wire 7 is a wire connecting the first wiring layer 6 and the substrate 1. Apart of the first bonding wire 7 is embedded in the third resin element 8 and sealed. A portion of the first bonding wire 7 which is not embedded in the third resin element 8 is sealed within the sealing material 23. The first bonding wire 7 connects an electrode pad on the side opposite to the surface of the first wiring layer 6 facing the first memory chip 2 and an electrode pad on the substrate 1.

The third resin element 8 has an adhesive resin composition an can be a DAF and is provided between the first wiring layer 6 and the third memory chip 9. In the third resin element 8, a part of the first bonding wires 7 is embedded and the third memory chip 9A located closest to a first memory chip 2 side and the third resin element 8 are stacked as a FOW.

It is preferable that a distance from the substrate 1 to the surface on the first memory chip 2 side of the third resin element 8 be longer than a distance from the substrate 1 to the upper surface of the controller chip 4. If the first resin element 3 is too thin, the fifth bonding wire 5 and the surface of the first memory chip 2 on the substrate 1 side are in contact with each other. If a distance from the substrate 1 to the surface on the first memory chip 2 side of the third resin element 8 is too short, the fifth bonding wire 5 and the surface on the substrate 1 side of the third resin element 8 are in contact with each other. Although the substrate 1 and the controller chip 4 can be connected also by the bonding wire (for example, bonding wire 24 in FIG. 2) extending in a Z direction from the upper surface of the controller chip 4, the bonding wires connecting the controller chip 4 and the substrate 1 become overcrowded.

The third memory chips 9 (9A, 9B, 9C, and 9D) are one or more memory chip groups provided on the third resin element 8. The adhesive layers 12 (12A, 12B, and 12C) are provided between the third memory chip 9, and bond the third memory chip 9. The first wiring layer 6 and the third memory chip 9 are connected to each other by a second bonding wire 10. The third memory chips 9 are connected to each other by seventh bonding wires 11 (11A, 11B, and 11C).

The second bonding wire 10 is a wire connecting the first wiring layer 6 and the third memory chip 9. The second bonding wire 10 is a wire connecting an electrode pad of the third memory chip 9 located closer to the center of the semiconductor device 100 than the first wiring layer 6 on the upper side of the first wiring layer 6, and an electrode pad on the side opposite to a controller chip 4 side of the first wiring layer 6.

The seventh bonding wires 11 (11A, 11B, and 11C) are wires connecting electrically between the third memory chips 9. The wiring direction of the seventh bonding wire 11 is the same as the wiring direction of the second bonding wire 10, but different from the wiring direction of the first bonding wire 7.

The adhesive layers 12 (12A, 12B, and 12C) are adhesive resin layers arranged between the third memory chips 9. For example, the adhesive layer 12 can be a DAF.

The second memory chip 13 is the semiconductor chip provided on the side opposite to the first memory chip 2 as viewed from the controller chip 4. The second memory chip 13 is provided on the second resin element 14 on the substrate 1.

The second resin element 14 has an adhesive resin composition such as a DAF. The second resin element 14 is provided on the substrate 1, and bonded to the second memory chip 13. The second resin element 14 is provided on the side opposite to the first resin element 3 as viewed from the controller chip 4. In the second resin element 14, one or more sixth bonding wires 15 which are one group of the bonding wires connecting the controller chip 4 and the substrate 1, are located. Since the wires are embedded in the second resin element 14, a structure in which the second memory chip 13 is stacked with the second resin element 14 is a FOW (Film on Wire).

The sixth bonding wire 15 is the bonding wire connecting the substrate 1 and the controller chip 4. The sixth bonding wire 15 is provided on the side opposite to the fifth bonding wire 5 as viewed from the controller chip 4. The sixth bonding wire 15 connects an electrode pad on the substrate 1 (not shown in FIG. 1) and the electrode pad of the controller chip 4. The sixth bonding wire 15 is located between the second memory chip 13 and the substrate 1. At least a part of the substrate 1 side of the sixth bonding wire 15 is embedded in the second resin element 14 and sealed. When a portion in which the sixth bonding wire 15 is not embedded in the second resin element 14 is provided, the portion is sealed with the sealing material 23.

The second wiring layer 16 is a rewiring layer provided on the second memory chip 13. The second wiring layer 16 is provided on the side opposite to the first wiring layer 6 as viewed from the controller chip 4. The second wiring layer 16 is connected to the second memory chip 13. The second wiring layer 16 and the second memory chip 13 are directly in contact with each other, and an electrode pad of the second memory chip 13 is connected electrically to a wire of the second wiring layer 16. By using the second wiring layer 16, a third bonding wire 17 connecting the second memory chip 13 and the substrate 1 can be provided on a side other than the side opposite to the side of the first wiring layer 6 facing the second wiring layer 16. A size of the second wiring layer 16, more specifically, a size of the surface (and opposite surface) facing the second memory chip 13 is smaller than that of the second memory chip 13.

The third bonding wire 17 is a wire connecting the second wiring layer 16 and the substrate 1. The third bonding wire 17 is provided on the side opposite to the first bonding wire 7 as viewed from the controller chip 4. A part of the third bonding wire 17 is embedded in the fourth resin element 18 and sealed. A portion in which the third bonding wire 17 is not embedded in the fourth resin element 18, is sealed with the sealing material 23. The third bonding wire 17 connects an electrode pad on the side opposite to the surface facing the second memory chip 13 of the second wiring layer 16 and an electrode pad on the substrate 1.

The fourth resin element 18 has an adhesive resin composition such as a DAF and is provided between the second wiring layer 16 and the fourth memory chip 19. The fourth resin element 18 is provided on the side opposite to the third resin element 8, as viewed from the controller chip 4. In the fourth resin element 18, a structure in which a part of the third bonding wire 17 is embedded and the fourth memory chip 19A located closest to a second memory chip 13 side and the fourth resin element 18 are stacked, is a FOW.

The fourth memory chips 19 (19A, 19B, 19C, and 19D) are one or more memory chip groups provided on the fourth resin element 18. The fourth memory chip 19 is provided on the side opposite to the third memory chip 9 as viewed from the controller chip 4. Between the fourth memory chip 19, the adhesive layers 22 (22A, 22B, and 22C) are provided and bond the fourth memory chip 19. The second wiring layer 16 and the fourth memory chip 19 are connected to each other by a fourth bonding wire 20. The fourth memory chips 19 are connected to each other by eighth bonding wires 21 (21A, 21B, and 21C).

The fourth bonding wire 20 is a wire connecting the second wiring layer 16 and the fourth memory chip 19. The fourth bonding wire 20 is provided on the side opposite to the second bonding wire 10, as viewed from the controller chip 4. The fourth bonding wire 20 is a wire connecting an electrode pad of the fourth memory chip 19 located closer to the center of the semiconductor device 100 than the second wiring layer 16 on the upper side of the second wiring layer 16, and an electrode pad on the side opposite to the controller chip 4 side of the second wiring layer 16.

The eighth bonding wires 21 (21A, 21B, and 21C) are wires connecting between the fourth memory chips 19. The wiring direction of the eighth bonding wire 21 is the same as the wiring direction of the fourth bonding wire 20, but different from the wiring direction of the third bonding wire 17.

The adhesive layers 22 (22A, 22B, and 22C) are the adhesive resin layers provided between the fourth memory chips 19. For example, the adhesive layer 22 is a DAF.

The sealing material 23 seals a member provided on the substrate 1. The sealing material 23 also is an exterior material of the semiconductor device 100. The sealing material 23 is a hard resin composition, more specifically, a molding resin.

Figure 2:
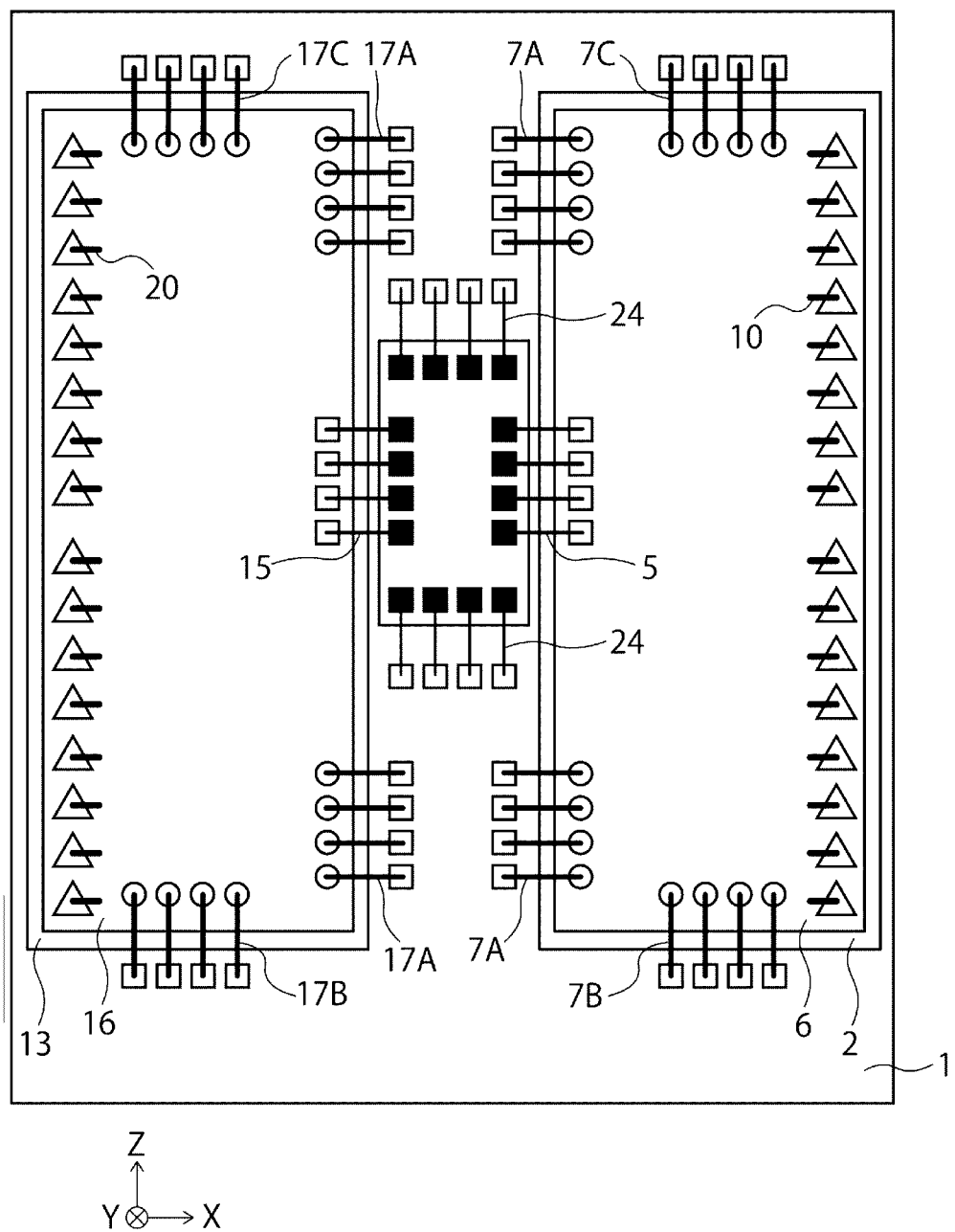
FIG. 2 illustrates a schematic plan view of a part of the semiconductor device according to the embodiment.

Here, by using a wiring schematic diagram of the semiconductor device 100 of FIG. 2, the arrangement of the wires and the configuration members in the semiconductor device 100 will be described. In the schematic diagram of FIG. 2, wiring viewed from the upper side of the schematic diagram of FIG. 1 is shown. Although wires other than electrode pads are provided in the first wiring layer 6 and the second wiring layer 16, the wires of the first wiring layer 6 and the second wiring layer 16 in the schematic diagram of FIG. 2, are omitted. Wiring between the substrate 1, the first memory chip 2, the second memory chip 13, the first wiring layer 6, and the second wiring layer 16 is schematically shown. The electrode pads of the substrate 1 are shown by white squares. The electrode pads of the controller chip 4 are shown by black squares. The electrode pads provided on the side opposite to the side of the first wiring layer 6 facing the second wiring layer 16 are shown by triangles. The electrode pads provided on the side opposite to the side of the second wiring layer 16 facing the first wiring layer 6 are shown by triangles. Electrode pads provided at a portion other than the side opposite to the side of the first wiring layer 6 facing the second wiring layer 16 are shown by circles. Electrode pads provided at a portion other than the side opposite to the side of the second wiring layer 16 facing the first wiring layer 6 are shown by circles.

First, the wiring of the controller chip 4 will be described. The controller chip 4 is connected to the substrate 1 by the bonding wires (5, 15, and 24). There is no wire that directly contacts the controller chip 4 and the memory chip. The wiring of the controller chip 4 and the memory chip are both through the first wiring layer 6 or the second wiring layer 16 and the substrate 1. The fifth bonding wire 5 extends from the controller chip 4 to the lower side of the first memory chip 2 and connects the controller chip 4 and the substrate 1. The sixth bonding wire 15 is similarly located on a second memory chip 13 side. It is preferable that the bonding wire 25 connecting the controller chip 4 and the substrate 1 be provided also in a depth direction (in Z direction) of FIG. 1. Since the bonding wires connected to the controller chip 4 are also located in the lower side of the memory chip, even if the chips in the semiconductor device 100 are arranged at high density, wiring can be performed without major restrictions in layout.

Next, the wiring of the first wiring layer 6 and the substrate 1 will be described. Since all memory chips used for the semiconductor device 100 are the same, if the first wiring layer 6 is not used, the wires between the first memory chip 2 and the substrate 1 extend from an electrode pad of the first memory chip 2 connected to the second bonding wire 10 toward the outer periphery (opposite or adjacent outer periphery) of the substrate 1. In FIG. 1 and FIG. 2, the bonding wires are not formed from the long side opposite to the controller chip 4 side of the memory chip toward the side opposite to the controller chip 4 side. If the bonding wires are formed from the long side opposite to the controller chip 4 side of the memory chip to the opposite side to the controller chip 4 side, it is necessary to make the substrate 1 and the semiconductor device 100 larger, by the amount of the bonding wires, the semiconductor device 100 becomes larger, and the wiring of the controller chip 4 becomes difficult. In the embodiment, the first bonding wires 7 are provided at a portion other than the side opposite to the side of the first wiring layer 6 toward the second wiring layer 16. That is, the first bonding wires 7 connecting the first wiring layer 6 and the substrate 1 do not straddle the side opposite to the controller chip 4 side of the first memory chip 2. In FIG. 2, the first bonding wires 7 connecting the first wiring layer 6 and the substrate 1 are formed in three directions. The first bonding wire 7A is provided from the long side of the first wiring layer 6 toward a second wiring layer 16 side. The first bonding wires 7B and 7C are provided from the short side of the first wiring layer 6. One or two of the first bonding wires 7A, 7B, and 7C can be omitted. That is, an example in which the first bonding wires 7 are provided only on one side or two sides of the first wiring layer 6 also falls within in the embodiment. The wiring layout of the first wiring layer 6 is designed in any location within a range satisfying the above requirements.

The wiring of the second wiring layer 16 and the substrate 1 are the same those of the first wiring layer 6 and the substrate 1. In the embodiment, the third bonding wires 17 are provided at a portion other than the side opposite to the side of the second wiring layer 16 toward the first wiring layer 6. That is, the third bonding wires 17 connecting the second wiring layer 16 and the substrate 1 do not extend over the side surface of the second memory chip 13 of the side opposite to the controller chip 4 side.

Since there is no wire bonding from the lowermost memory chips 2 and 13 to the substrate 1 outside, the external dimensions of the semiconductor device can be reduced accordingly. If the external dimensions are not changed, a larger memory chip and a larger controller chip 4 for speeding up can be accommodated. If the mounting positions of the lowermost memory chips are arranged outward by the amount of the wires which are not present, more memory chips can be stacked in steps until a distance between the uppermost memory chips is almost eliminated. The semiconductor device 100 according to the embodiment contributes to the downsizing, large capacity, and speeding up of the semiconductor device.

Adopting the layout of the semiconductor device 100 contributes to downsizing and thinning when the same chip is used. Then, by increasing the chip size or increasing the number of memory chips, it is possible to increase the capacity and speed of the semiconductor device 100. Also, in this case, by adopting the layout of the semiconductor device 100 according to the embodiment, since the chips can be efficiently arranged and wired, a thin and compact semiconductor device 100 can be provided even if the size of the chips or the number of chips increases.

In a semiconductor device of a comparative example, the controller chip and the bonding wires can be covered with a thick DAF of, for example, greater than or equal to 100 μm, a silicon or polyimide spacer is provided thereon, and the memory chip is stacked on the spacer. In such a comparative example, since the height of the semiconductor device in the Y direction increases by the thickness of the DAF and/or the spacer, it is difficult to reduce the thickness.

In the semiconductor device 100 according to the embodiment, which does not use a spacer, it is possible to reduce the height of the semiconductor device 100 in the Y direction, and a structure of the embodiment also contributes to the thinning of the semiconductor device 100.

Figure 3:
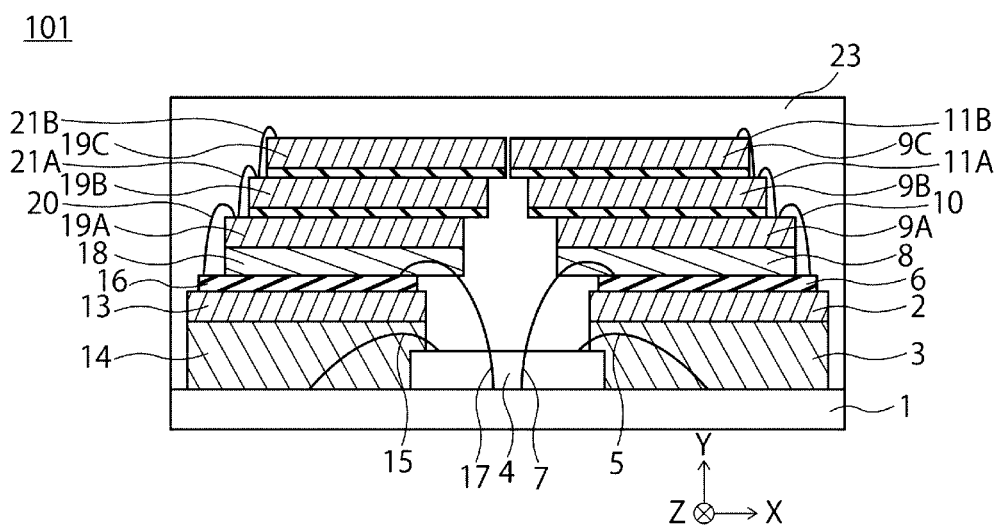
FIG. 3 illustrates a schematic cross-sectional view of the semiconductor device according to the embodiment.

FIG. 3 shows a schematic cross-sectional view of a semiconductor device 101 of a modified example of the semiconductor device 100.

In the semiconductor device 101 shown in FIG. 3, a part of the controller chips 4 is embedded in the first resin element 3 and the second resin element 14. A part of the controller chip 4 is embedded in the first and second resin elements (3 and 14) and thus the memory chips are closer than in the semiconductor device 100 in FIG. 1 such that a width (distance in X direction) of the semiconductor device 101 can be further narrowed. Furthermore, although the size of the controller chip 4 might increase, with such a structure as depicted in FIG. 3, the width of the semiconductor device 101 can remain narrowed, which contributes to the downsizing of the semiconductor device 101. A part or even all of the fifth bonding wires 5 can be embedded in the first resin element 3. A part or even all of the sixth bonding wires 15 can be embedded in the second resin element 14.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
    a first semiconductor element on a first resin element on a substrate;
    a second semiconductor element on a second resin element on the substrate;
    a third semiconductor element on the substrate between the first resin element and the second resin element;
    a first wiring layer on the first semiconductor element, connected to the first semiconductor element, and connected to the substrate with a first bonding wire;
    a fourth semiconductor element on the first wiring layer and connected to the first wiring layer with a second bonding wire;
    a second wiring layer on the second semiconductor element, connected to the second semiconductor element, and connected to the substrate with a third bonding wire; and
    a fifth semiconductor element on the second wiring layer and connected to the second wiring layer with a fourth bonding wire, wherein
    the first bonding wire is at a side of the first wiring layer other than a side farthest away from the second wiring layer, and
    the third bonding wire is at a side of the second wiring layer other than a side farthest away from the first wiring layer.

2. The semiconductor device according to claim 1, wherein
    the first semiconductor element, the second semiconductor element, the fourth semiconductor element, and the fifth semiconductor element are memory chips,
    the third semiconductor element is a controller chip, and
    a center of a virtual line connecting a center of the first semiconductor element and a center of the second semiconductor element overlaps the third semiconductor element in a stacking direction of the third semiconductor element on the substrate.

3. The semiconductor device according to claim 1, wherein a part of the third semiconductor element is embedded within the first resin element and the second resin element.

4. The semiconductor device according to claim 1, wherein
    the third semiconductor element includes a fifth bonding wire and a sixth bonding wire that are connected to the substrate,
    at least a portion of the fifth bonding wire is within the first resin element, and
    at least a portion of the sixth bonding wire is within the second resin element.

5. The semiconductor device according to claim 1, further comprising:
    a third resin element that is between the first semiconductor element and the fourth semiconductor element; and
    a fourth resin element that is between the second semiconductor element and the fifth semiconductor element, wherein
    a portion of the first bonding wire is within the third resin element, and
    a portion of the third bonding wire is within the fourth resin element.

6. A semiconductor device, comprising:
    a first resin layer on a substrate;
    a first semiconductor memory chip on the first resin layer;
    a second resin layer on the substrate;
    a second semiconductor memory chip on the second resin layer;
    a controller chip on the substrate between the first resin layer and the second resin layer;
    a first wiring layer on the first semiconductor memory chip and electrically connected to the first semiconductor memory chip;
    a plurality of first bonding wires connected between electrodes on an upper surface of the first wiring layer and electrodes on the substrate;
    a third semiconductor memory chip on the first wiring layer; and
    a plurality of second bonding wires connected between electrodes on the upper surface of the first wiring layer and electrodes on an upper surface of the third semiconductor memory chip, wherein
    first bonding wires are provided along and adjacent to a first side of the upper surface facing the second semiconductor memory chip, and none of the first bonding wires are provided along and adjacent to a second side of the upper surface opposite to the first side, and
    the second bonding wires are provided along and adjacent to the second side of the upper surface, and none of the second bonding wires are provided along and adjacent to the first side.

7. The semiconductor device according to claim 6, wherein first bonding wires are also provided along and adjacent to third and fourth sides of the upper surface that connect the first side and the second side, and are opposite to each other.

8. The semiconductor device according to claim 6, further comprising:
a second wiring layer on the second semiconductor memory chip and electrically connected to the second semiconductor memory chip;
a plurality of third bonding wires connected between electrodes on an upper surface of the second wiring layer and electrodes on the substrate;
a fourth semiconductor memory chip on the second wiring layer; and
a plurality of fourth bonding wires connected between electrodes on the upper surface of the second wiring layer and electrodes on an upper surface of the fourth semiconductor memory chip, respectively, wherein
the third bonding wires are provided along and adjacent to a first side of the upper surface of the second wiring layer facing the first semiconductor memory chip, and none of the third bonding wires are provided along and adjacent to a second side of the upper surface of the second wiring layer opposite to the first side thereof, and
the fourth bonding wires are provided along and adjacent to the second side of the upper surface of the second wiring layer, and none of the fourth bonding wires are provided along and adjacent to the first side of the upper surface of the second wiring layer.

9. The semiconductor device according to claim 8, wherein third bonding wires are also provided along and adjacent to third and fourth sides of the upper surface of the second wiring layer that connect the first side and the second side thereof, and are opposite to each other.

10. The semiconductor device according to claim 8, further comprising:
a plurality of fifth bonding wires connected between electrodes on the upper surface of the controller chip and electrodes provided along and adjacent to the first side of the upper surface of the first wiring layer.

11. The semiconductor device according to claim 10, wherein at least one of the plurality of fifth bonding wires extends through the first resin layer.

12. The semiconductor device according to claim 11, further comprising:
a plurality of sixth bonding wires connected between electrodes on the upper surface of the controller chip and electrodes provided along and adjacent to the first side of the upper surface of the second wiring layer.

13. The semiconductor device according to claim 11, wherein at least one of the plurality of sixth bonding wires extends through the second resin layer.

14. The semiconductor device according to claim 8, further comprising:
a third resin layer between the first wiring layer and the third semiconductor memory chip, wherein
at least one of the first bonding wires extends through the third resin layer.

15. The semiconductor device according to claim 14, further comprising:
a fourth resin layer between the second wiring layer and the fourth semiconductor memory chip, wherein
at least one of the third bonding wires extends through the fourth resin layer.

16. The semiconductor device according to claim 15, wherein the third resin layer is offset toward the fourth resin layer with respect to the first wiring layer.

17. The semiconductor device according to claim 16, wherein the fourth resin layer is offset toward the third resin layer with respect to the second wiring layer.

18. The semiconductor device according to claim 16, wherein a first edge part of the controller chip is covered with the first resin layer, and a second edge part of the controller chip is covered with the second resin layer.

19. The semiconductor device according to claim 18, wherein the first edge part of the controller chip includes a first side surface of the controller chip and the second edge part of the controller chip includes a second side surface of the controller chip opposite to the first side surface.

20. The semiconductor device according to claim 16, wherein no bonding wire directly connects the controller chip to the first semiconductor memory chip, and no bonding wire directly connects the controller chip to the second semiconductor memory chip is provided.

* * * * *